United States Patent
Mori et al.

(10) Patent No.: US 6,747,277 B2
(45) Date of Patent: Jun. 8, 2004

(54) X-RAY IMAGE PICKUP APPARATUS AND METHOD OF MAKING THE SAME

(75) Inventors: Harumichi Mori, Hamamatsu (JP); Ryuji Kyushima, Hamamatsu (JP); Kazuki Fujita, Hamamatsu (JP); Masahiko Honda, Hamamatsu (JP); Takuya Homme, Hamamatsu (JP)

(73) Assignee: Hamamatsu Photonics K.K., Shizuoka (JP)

( * ) Notice: Subject to any disclaimer, the term of this patent is extended or adjusted under 35 U.S.C. 154(b) by 70 days.

(21) Appl. No.: 10/214,332

(22) Filed: Aug. 8, 2002

(65) Prior Publication Data

US 2002/0195568 A1 Dec. 26, 2002

Related U.S. Application Data

(63) Continuation-in-part of application No. PCT/JP01/01356, filed on Feb. 23, 2001.

(30) Foreign Application Priority Data

Feb. 25, 2000 (JP) .................................... P2000-049616

(51) Int. Cl.[7] ................................................ G01T 1/24
(52) U.S. Cl. ............................. 250/370.11; 250/370.01
(58) Field of Search ........................ 250/370.11, 347.01, 250/336.1

(56) References Cited

U.S. PATENT DOCUMENTS

| | | | | |
|---|---|---|---|---|
| 4,870,279 A | * | 9/1989 | Cueman et al. | 250/368 |
| 5,834,782 A | | 11/1998 | Schick et al. | 250/370.11 |
| 6,091,795 A | * | 7/2000 | Schafer et al. | 378/19 |
| 2002/0092992 A1 | * | 7/2002 | Izumi | 250/370.12 |

FOREIGN PATENT DOCUMENTS

| | | |
|---|---|---|
| JP | 01 223729 | 9/1989 |
| JP | 5-312960 | 11/1993 |
| JP | 09 54162 | 2/1997 |
| JP | 9-257942 | 10/1997 |
| JP | 9-260626 | 10/1997 |
| JP | 11-94947 | 4/1999 |

* cited by examiner

*Primary Examiner*—David Porta
*Assistant Examiner*—Christine Sung
(74) *Attorney, Agent, or Firm*—Morgan, Lewis & Bockius LLP

(57) ABSTRACT

In an X-ray image pickup apparatus comprising first and second semiconductor image sensor chips 14A, 14C arranged adjacent each other on a base plate 20, and a single scintillator panel 40 disposed on the first and second semiconductor image sensor chips, respective planes including surfaces of photosensitive regions of the first and second semiconductor image sensor chips have normals intersecting at a predetermined angle.

13 Claims, 7 Drawing Sheets

X-RAY IMAGE PICKUP APPARATUS AND METHOD OF MAKING THE SAME

RELATED APPLICATION

This is a continuation-in-part application of application serial no. PCT/JP01/01356 filed on Feb. 23, 2001, now pending.

BACKGROUND OF THE INVENTION

1. Field of the Invention

The present invention relates to an X-ray image pickup apparatus, more specifically, a large-screen X-ray image pickup apparatus which can carry out actual-size readout with respect to information sources, and a method of making the same.

2. Related Background Art

Since X-ray image pickup apparatus having a large detection area can read out inner information of a specimen by means of an optical system having a power of 1:1 with respect to the specimen, they have been expected for use, for example, in medical fields such as general diagnoses of chest, digestive organs, circulatory organs, and mammography; and their development has remarkably been in progress.

It is ideal for such a large X-ray image pickup apparatus to use a single-plate panel-like semiconductor image sensor having a large area as imaging means for making it possible to capture X-ray images. However, since the yield per sheet of the panel-like semiconductor image sensor decreases as its area becomes larger, sufficient performances and lower cost are hard to achieve at present.

Therefore, a large X-ray image pickup apparatus uses imaging means having a structure in which a plurality of panel-like semiconductor image sensors are arranged side-by-side as being attached to each other like tiles on a base plate made of a hard substrate.

For example, Japanese Patent application Laid-Open No. HEI 9-260626 discloses a photoelectric converter apparatus for an X-ray image pickup apparatus and the like, in which four panel-like semiconductor image sensors are arranged side-by-side as being attached to each other like tiles on a base plate made of a hard substrate.

SUMMARY OF THE INVENTION

However, the above-mentioned X-ray image pickup apparatus using a plurality of panel-like semiconductor image sensors has been problematic heretofore in that desirable excellent image resolutions cannot be obtained.

Though one using a soft intensifying screen in place of the base plate made of a hard substrate has also been known, it has been problematic in that it fails to yield a sufficient image resolution whereas its handling in the manufacturing process is unfavorable.

In view of the foregoing problems, it is an object of the present invention to provide an X-ray image pickup apparatus which has a favorable image resolution and can easily be made at a low cost, and a method of making the same.

The X-ray image pickup apparatus in accordance with the present invention is an X-ray image pickup apparatus comprising first and second semiconductor image sensor chips arranged adjacent each other on a base plate, and a scintillator panel disposed on the first and second semiconductor image sensor chips; wherein respective planes including surfaces of photosensitive regions of the first and second semiconductor image sensor chips are intersected at a predetermined angle.

The inventors studied reasons why excellent desirable image resolutions have not been obtained so far in the conventional X-ray image pickup apparatus using a plurality of panel-like semiconductor image sensors, and have found that the warpage occurring in the scintillator panel used for converting the wavelength of X-rays is greatly influential. This warpage is generated by a heat treatment carried out when depositing a fluorescent substance on a surface of X-ray-transparent hard substrate so as to form a fluorescent substance layer in the process of making the scintillator panel. The warpage becomes greater as the area of the scintillator panel is larger.

In the conventional X-ray image pickup apparatus, a plurality of panel-like semiconductor image sensors are disposed so as to face the scintillator panel, while being adjacent each other with their respective photosensitive regions being arranged on a single plane having no steps. Here, since the scintillator panel usually has warpage, a gap occurs between the scintillator panel and each of the photosensitive regions of a plurality of panel-like semiconductor image sensors. Also, when the surface of the scintillator is divided into a plurality of partial areas, and the gap occurring with respect to each of the photosensitive regions of the panel-like semiconductor image sensors is taken into consideration for each partial area, the size of gap greatly fluctuates among a plurality of partial areas, whereby the image resolution greatly deteriorates.

For example, the X-ray image pickup apparatus disclosed in Japanese Patent Application Laid-Open No. HEI 9-260626 tries to improve the image resolution by arranging respective photosensitive regions of four panel-like semiconductor image sensors on a single plane having no steps by adjusting the thickness of the adhesive bonding the four panel-like semiconductor image sensors and the base plate on which they are disposed side-by-side like tiles. In this X-ray image pickup apparatus, a fluorescent substance is directly deposited on the photosensitive regions of the four panel-like semiconductor image sensors, whereby the photosensitive regions are considered to deteriorate due to the heat treatment carried out at the time of evaporation.

Also, a structure using a separate scintillator panel so that the surface of the X-ray fluorescent substance layer is brought into close contact with the photosensitive regions of panel-like semiconductor image sensors does not seem to yield a sufficient image resolution, since it cannot overcome the above-mentioned problem caused by the warpage occurring in the scintillator panel.

In the present invention, by contrast, the surfaces of photosensitive regions of a plurality of semiconductor image sensor chips are not parallel to each other, i.e., the surfaces are intersected at a predetermined angle, whereby the respective photosensitive regions of a plurality of panel-like semiconductor image sensors can attain their optimal arrangement positions in conformity to the curved surface of scintillator panel. Therefore, the fluctuation in gaps between a plurality of partial areas of the curved surface of scintillator panel and the photosensitive regions of semiconductor image sensor chips can be reduced dramatically as compared with that conventionally exhibited. Namely, a plurality of partial areas of the scintillator panel and the respective photosensitive regions of a plurality of semiconductor image sensor chips come into close contact with each other more favorably than in the conventional cases.

This X-ray image pickup apparatus also comprises a buffer member, whereby the contact of the respective photosensitive regions of a plurality of panel-like semiconductor image sensors with the curved surface of the scintillator panel can be held more favorably upon receiving a pressure caused by the buffer member.

The pressure caused by the buffer member can be adjusted to such an extent that the photosensitive regions of the semiconductor image sensor chips and the curved surface of the X-ray fluorescent substance layer of the scintillator panel in contact therewith do not yield such inconveniences as damages and peeling of the fluorescent substance. As a consequence, the X-ray image pickup apparatus of the present invention can attain a favorable resolution and improves the yield.

The magnitude of warpage of the scintillator panel can be measured actually, though it can indirectly be measured by grasping it beforehand upon determining the constituent material of the hard substrate partly constituting the panel and the constituent material of the X-ray fluorescent substance layer and determining the condition for depositing the fluorescent substance. As a consequence, the individual photosensitive regions can successively be made under a fixed arrangement condition, whereby a high productivity can be realized.

In the X-ray image pickup apparatus, the base plate may have an inclined face constituting a bottom part of a case and corresponding to an inclination of a plurality of panel-like semiconductor image sensors. As a consequence, the arrangement of the respective photosensitive regions of a plurality of semiconductor image sensor chips with respect to a plurality of partial areas of the scintillator panel can be adjusted according to the inclination of the surface of support for mounting an imaging unit. The imaging unit is constituted by the semiconductor image sensor chips and image sensor substrates.

For adjusting the extent of warpage, the X-ray image pickup apparatus of the present invention may use a height adjusting part disposed between the bottom part of the case and a plurality of panel-like semiconductor image sensors. This can adjust the arrangement of the respective photosensitive regions of a plurality of semiconductor image sensor chips with respect to a plurality of partial areas of the scintillator panel according to the form, size, and arrangement position of the height adjusting part disposed on the surface of support for mounting the imaging unit.

Also, the X-ray image pickup apparatus of the present invention can carry out adjustment by using an adhesive for bonding the bottom part of the case and a plurality of panel-like semiconductor image sensors. This can adjust the arrangement of the respective photosensitive regions of a plurality of semiconductor image sensor chips with respect to a plurality of partial areas of the scintillator panel according to the amount of supply, thickness, and coating position of the adhesive applied onto the surface of support for mounting the imaging unit.

Further, in the X-ray image pickup apparatus of the present invention, the fluorescent substance may be a needle or columnar crystal vertically growing on a surface of the hard substrate.

Also, in the X-ray image pickup apparatus of the present invention, the hard substrate may be formed from at least one kind of constituent material selected from the group consisting of Al, $SiO_2$, Be, and C.

The manufacturing method of the present invention comprises a first step of measuring an extent of warpage of a scintillator panel; a second step of applying an adhesive onto a base plate; a third step of inclining a plurality of semiconductor image sensor chips according to the extent of warpage and sticking the plurality of semiconductor image sensor chips on the adhesive; a fourth step of disposing the scintillator panel on the plurality of semiconductor image sensor chips; and a fifth step of disposing and pressing a buffer member on the scintillator panel.

DESCRIPTION OF THE PREFERRED EMBODIMENT

In the following, preferred embodiments of X-ray image pickup apparatus will be explained in detail with reference to the drawings. In the following explanation, parts identical or corresponding to each other will be referred to with numerals identical to each other without repeating their overlapping descriptions.

Figure 1:
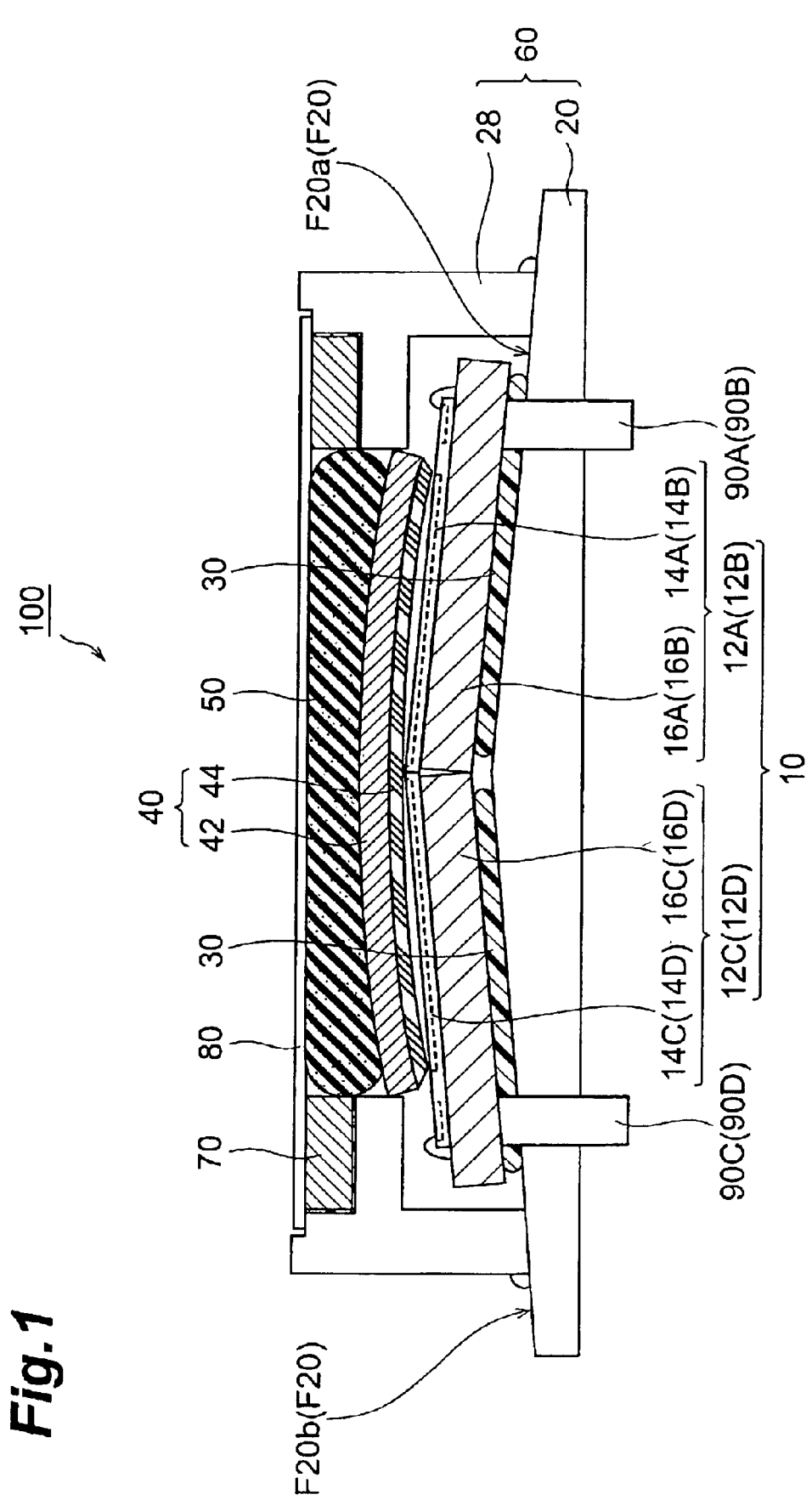
FIG. 1 is a schematic sectional view showing a preferred embodiment of X-ray image pickup apparatus.
Figure 2:
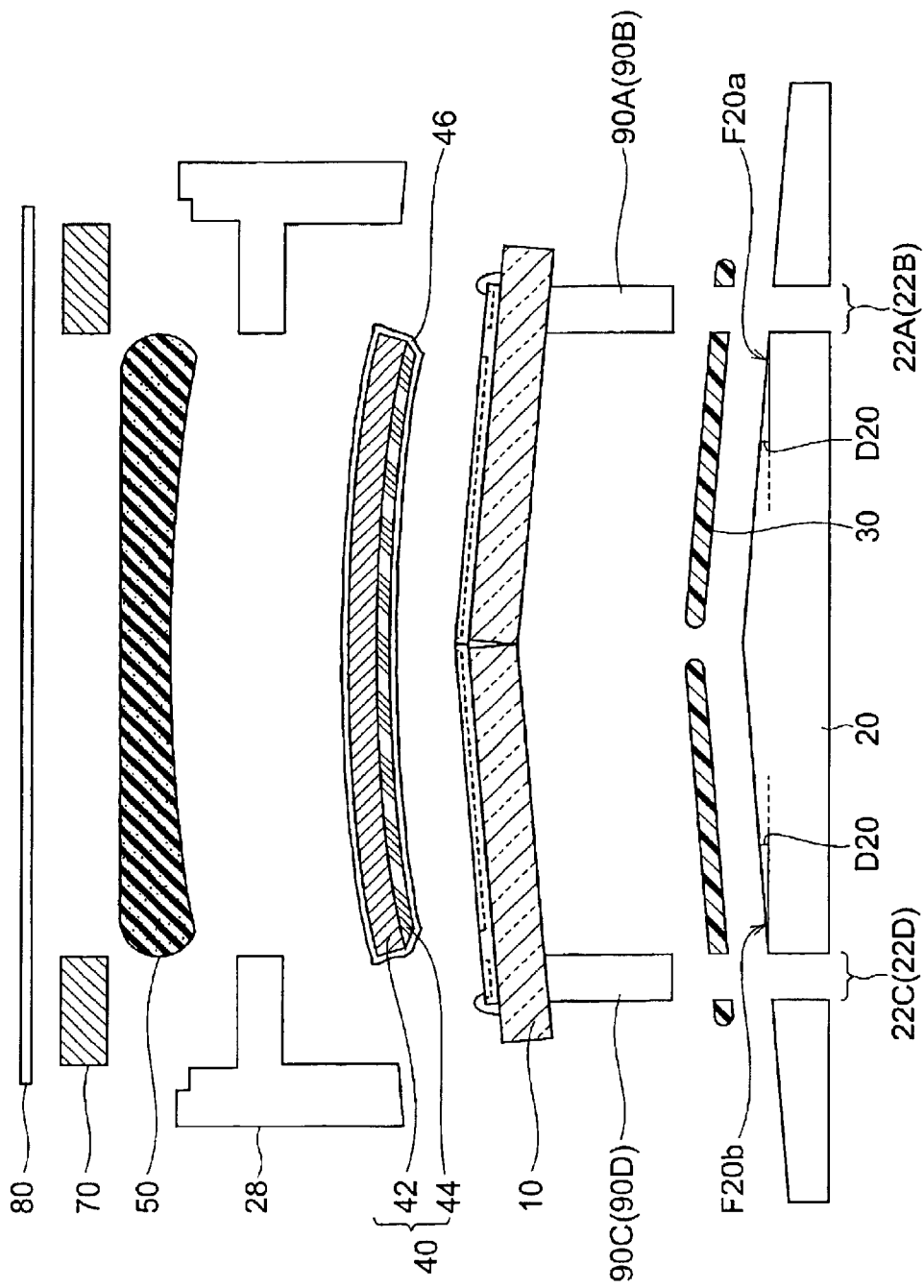
FIG. 2 is a schematic exploded sectional view of the X-ray image pickup apparatus of FIG. 1.
Figure 3:
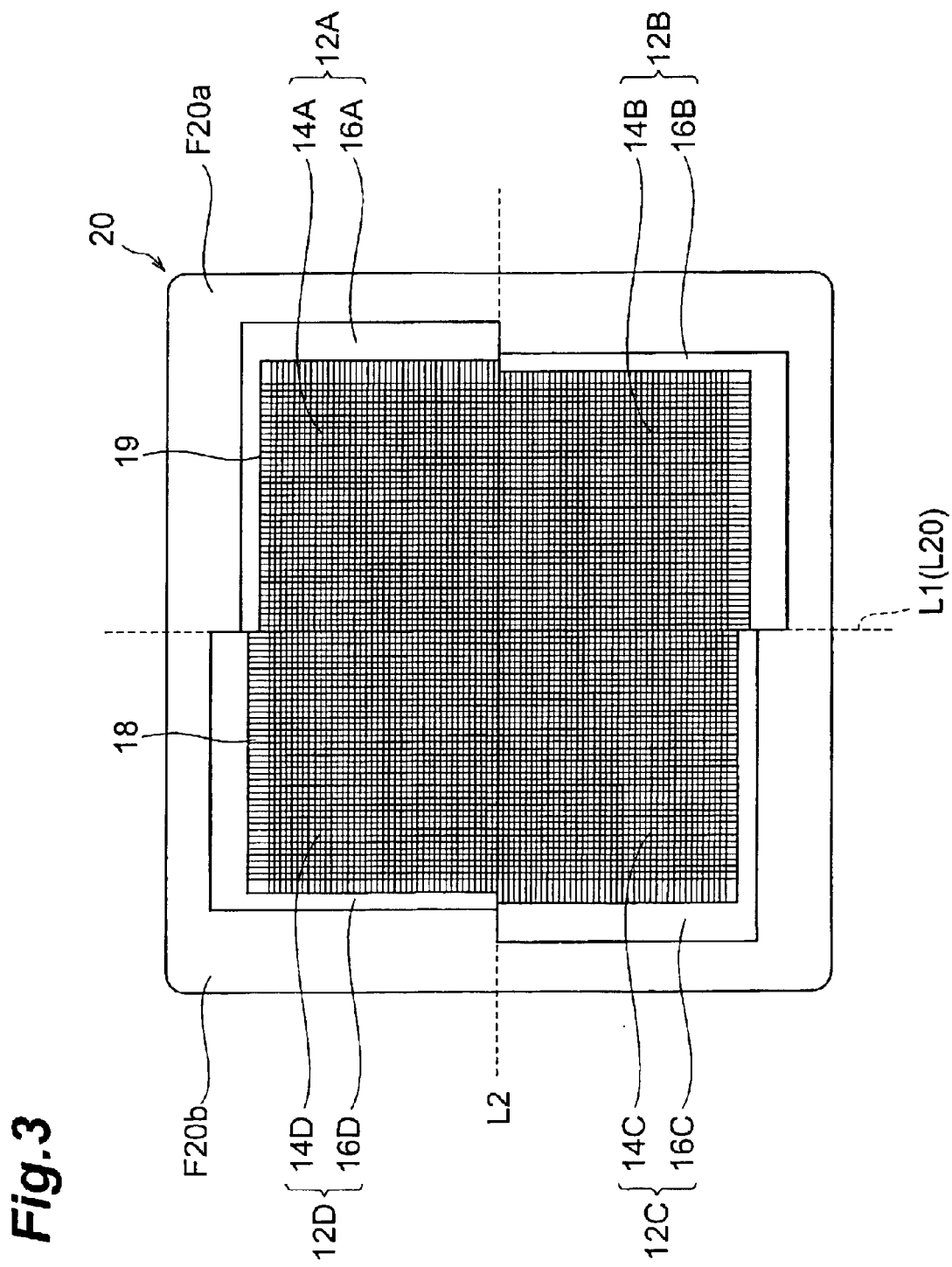
FIG. 3 is a schematic plan view of panel-like semiconductor image sensors mounted on a base plate of the X-ray image pickup apparatus of FIG. 1.

FIG. 1 is aschematic sectional view showing a preferred embodiment of X-ray image pickup apparatus. FIG. 2 is a schematic exploded sectional view for clearly showing constituent parts of the X-ray image pickup apparatus of FIG. 1. FIG. 3 is a schematic plan view showing a state where four panel-like semiconductor image sensors in the X-ray image pickup apparatus of FIG. 1 are arranged like tiles on a base plate.

As shown in FIGS. 1 and 2, the X-ray image pickup apparatus 100 of this embodiment is mainly constituted by an imaging unit 10 having four panel-like semiconductor image sensors; a scintillator panel 40 mounted on a photosensitive region of the imaging unit 10; a case 60 constituted by a base plate 20 for mounting the imaging unit 10 and an outer frame member 28, mounted on the base plate 20, for securing the positions of the imaging unit 10 and the scintillator panel 40; an adhesive 30 for securing the imaging unit 10 onto the base plate 20; a cushion rubber 50 mounted on the scintillator panel 40; a shield member 70 incorporated in the frame 28; and a lid 80, mounted on the upper part of the frame 28, for closing the case 60.

The scintillator panel 40 and base plate 20 in FIGS. 1 and 2 are exaggerated such that the warpage of the scintillator panel 40 and the gradient of the mounting surface of base plate 20 for supporting the imaging unit 10 can easily be seen.

With reference to FIGS. 1 and 2, each of the constituents mentioned above will now be explained in detail.

As shown in FIGS. 1 and 2, the scintillator panel 40 is constituted by a hard substrate 42, which is a rectangular plate, and a crystalline (X-ray) fluorescent substance layer 44, uniformly deposited on one surface of the hard substrate 42, for generating fluorescence in response to X-rays incident thereon. The scintillator panel 40 converts X-rays made incident thereon from an external X-ray source (not depicted) and irradiates the four panel-like semiconductor image sensors within the imaging unit 10 with the resulting fluorescence yielding a sufficient sensitivity.

The hard substrate 42 is used for uniformly depositing the X-ray fluorescent substance layer 44 on one surface thereof. Since the X-ray fluorescent substance layer 44 is not directly formed on photosensitive regions of the panel-like semiconductor image sensors within the imaging unit 10 but on the hard substrate 42, a favorable image resolution can be obtained without damaging the photosensitive regions of panel-like semiconductor image sensors. The material constituting the hard substrate 42 is not limited in particular as long as it is transparent to X-rays and has such a hardness that crystals of the scintillator can grow thereon. For example, hard materials such as glass, aluminum, amorphous carbon, and beryllium are preferably selected.

The crystalline X-ray fluorescent substance layer 44 is a layer having a uniform thickness formed by growing crystals of a fluorescent substance on one surface of the hard substrate 42 by vacuum evaporation. Preferably, the crystals of the X-ray fluorescent substance layer 44 are needle or columnar crystals effective for the fluorescence by the X-rays. The fluorescent substance for forming the X-ray fluorescent substance layer 44 is not limited in particular, whereby an optimal fluorescent substance is appropriately selected according to the panel-like semiconductor image sensor employed. For example, CsI is used as the scintillator when a MOS image sensor is employed as a panel-like semiconductor image sensor.

The scintillator panel 40 has slight warpage occurring due to the heat treatment at the time of scintillator deposition and the crystal growth of the scintillator. For example, a warpage yielding a difference of about 1 mm between the center and peripheries of the scintillator panel is generated when a CsI layer (having a layer thickness of 250 $\mu$m) is formed by vacuum evaporation on a rectangular hard substrate (240 mm×240 mm with a sheet thickness of 0.5 mm) made of amorphous carbon, glass, or the like.

Preferably, the scintillator panel 40 is subjected to moisture-proof processing in order to keep the favorable X-ray fluorescence function of scintillator crystals in use. For example, the moisture-proof processing is carried out such that, as shown in FIG. 2, all the surfaces of the scintillator panel 40 are coated with parylene (polyparaxylene) 46 (with a coating thickness of 2 to 3 $\mu$m)

The imaging unit 10 is constituted by four panel-like semiconductor image sensors 12A, 12B, 12C, and 12D. Further, these panel-like semiconductor image sensors 12A to 12D are constituted by panel-like image sensor chips 14A, 14B, 14C, and 14D and panel-like semiconductor image sensor substrates 16A, 16B, 16C, and 16C for mounting the panel-like image sensor chips 14A to 14D, respectively.

As the panel-like semiconductor image sensor chips 14A to 14D, image sensor chips suitable for the X-ray image pickup apparatus are appropriately selected. For example, MOS image sensor chips are used. For the material constituting the semiconductor image sensor substrates 16A to 16D, materials having a coefficient of linear expansion relatively close to that of Si which is a main constituent material for the panel-like semiconductor image sensor chips 14A to 14D are appropriately selected.

As shown in FIG. 3, the four panel-like semiconductor image sensors 12A to 12D are arranged like tiles on the base plate 20 such that two sides of their adjoining photosensitive regions are disposed adjacent each other with no gaps therebetween. As a result, the four panel-like semiconductor image sensor chips 14A to 14D in total form a photosensitive region having a large area, thereby making it possible to capture the whole image of fluorescence by the X-ray fluorescent substance layer 44. For example, this image sensor group can construct a photosensitive region having a large area extending over a size of 25 cm×25 cm.

As shown in FIG. 3, respective amplifiers and respective shift registers of the panel-like semiconductor image sensor chips 14A to 14D are formed along the remaining two sides of their corresponding rectangular panel-like semiconductor image sensors 12A to 12D beforehand so as to be disposed in periphery of the photosensitive region having a large area formed after the four panel-like semiconductor image sensors 12A to 12D are arranged on the base plate 20.

The base plate 20 is a member mounting the imaging unit 10 thereon and functioning as adjusting means for adjusting the arrangement of four panel-like semiconductor image sensors 12A to 12D such that the respective gaps between a plurality of partial areas of the curved surface of the scintillator panel 40 and the individual photosensitive regions of the four panel-like semiconductor image sensors 12A to 12D are reduced according to the warpage of the scintillator panel 40.

As shown in FIG. 1, the base plate 20 is a rectangular plate, whereas its upper rectangular face F20 for mounting the four panel-like semiconductor image sensors 12A to 12D of the imaging unit 10 is constituted by two congruent inclined faces F20*a* and F20*b* having a slight gradient D20 upward from a pair of their opposing sides. Namely, as shown in FIGS. 1 and 2, the vertical cross section of the base plate 20 constitutes an isosceles triangle whose two sides included in the inclined faces F20*a* and F20*b* are equilateral.

When the four panel-like semiconductor image sensors 12A to 12D are mounted like tiles on the base plate 20, the four panel-like semiconductor image sensors 12A to 12D are grouped two by two, one set thereof is mounted on the inclined face F20*a*, and the other set is mounted on the inclined face F20*b*.

For example, when the four panel-like semiconductor image sensors 12A to 12D in FIG. 3 are grouped into a set of 12A and 12B, and a set of 12C and 12D, a contact line L1 at which these sets come into contact with each other after being arranged on the base plate 20 is superposed on a boundary line L20 between the inclined faces F20*a* and F20*b* of the base plate 20. When the four panel-like semiconductor image sensors 12A to 12D are grouped into a set of 12A and 12D, and a set of 12B and 12C, on the other hand, a contact line L2 at which these sets come into contact with each other after being arranged on the base plate 20 is superposed on the contact line L20 at which the inclined faces F20*a* and F20*b* in the upper part of the base plate 20 come into contact with each other. As a result, as shown in FIGS. 1 and 2, the photosensitive region having a large area formed by the four panel-like semiconductor image sensor chips 14A to 14D has a slight inclination D20.

Assuming that the plane including opposed two sides constituting the periphery of the base plate 20 be a horizontal plane, the slight gradient D20 formed by each of the inclined faces F20*a* and F20*b* is determined according to the extent of warpage of the scintillator panel 40. Consequently, the respective gaps between the photosensitive regions of the panel-like semiconductor image sensors 12A to 12D and the curved surface of the X-ray fluorescent substance layer 44 are sufficiently reduced, whereby the respective photosensitive regions of the panel-like semiconductor image sensors 12A to 12D can sufficiently come into close contact with the curved surface of the X-ray fluorescent substance layer 44.

The base plate 20 is formed from a hard material such as Al or ceramic which can support, without deforming even when a pressure is exerted thereon by the cushion rubber 50, the panel-like semiconductor image sensors 12A to 12D arranged thereon side-by-side like tiles.

The lower faces of the panel-like semiconductor image sensor substrates 16A to 16D are provided with connectors 90A, 90B, 90C, and 90D each having a columnar form. The base plate 20 is formed with fitting holes 22A, 22B, 22C, and 22D having forms and sizes corresponding to those of the connectors 90A to 90D, so that the connectors 90A to 90D can fit therein.

The connectors 90A to 90D and fitting holes 22A to 22D are used for arranging the panel-like semiconductor image sensors 12A to 12D like tiles with no gaps and mounting them on the base plate 20. To this aim, the connectors 90A to 90D are connected to the panel-like semiconductor image sensor substrates 16A to 16D such that the lower face of each of the panel-like semiconductor image sensor substrates 16A to 16D is parallel to its corresponding one of the two inclined faces F20a and F20b in the upper part of the base plate 20.

Similarly, the fitting holes 22A to 22D are formed in the base plate 20 such that the lower face of each of the panel-like semiconductor image sensor substrates 16A to 16D is parallel to its corresponding one of the two inclined faces F20a and F20b in the upper part of the base plate 20.

The adhesive 30 is used for securing the base plate 20 and the imaging unit 10, which have been subjected to the above-mentioned precise positioning, to each other. As the adhesive 30, room-temperature cured adhesives such as those of acrylic, epoxy, and silicone types, for example, are used. As an adhesive resin having an elasticity, such as rubber-like elasticity in particular, adhesive resins of silicone rubber type belonging to silicone type, butyl rubber type, polysulfide type, styrene rubber type, nitrile rubber type, chloroprene type, and the like can be used favorably. The adhesive 30 may be either of one-part type or two-part type, and these adhesives may be combined and used in mixture when necessary.

The cushion rubber 50 is a rectangular plate, and is mounted on the upper side of the scintillator panel 40. Preferred as the material constituting the cushion rubber 50 is one having such an elasticity that, when the cushion rubber 50 is formed, the gaps between the curved surface of the X-ray fluorescent substance layer 44 and the photosensitive regions of the four panel-like semiconductor image sensors 12A to 12D are sufficiently reduced, whereby they are sufficiently brought into close contact with each other without being damaged, and this state can be maintained. For example, rubbers (elastomers), rubbersponges, synthetic resins (other than elastomers), sponges made of synthetic resins, and the like can be used. Further, a preferred thickness of the cushion rubber 50 is determined according to the selected constituent material, whereby the cushion rubber 50 to be formed is adjusted so as to have a sufficient elasticity.

When the cushion rubber 50 formed from an elastic body is used, the cushion rubber 50 appropriately presses the scintillator panel 40 from thereon due to its elasticity, so as to sufficiently reduce the gaps between the curved surface of the X-ray fluorescent substance layer 44 and the respective photosensitive regions of the four panel-like semiconductor image sensors 12A to 12D of the imaging unit 10, whereby they come into close contact with each other without being damaged, and this state is maintained.

The frame 28 is a continuous annular body shaped like a rectangular ring, and is secured with a resin adhesive or the like onto the upper inclined faces F20a and F20b of the base plate 20. As shown in FIG. 1, the frame 28 secures the scintillator panel 40 and the cushion rubber 50 such that they abut against its rectangular ring from the inside, and positions and secures the scintillator panel 40 with respect to the respective photosensitive regions of the four panel-like semiconductor image sensors 12A to 12D of the imaging unit 10. To this aim, the frame 28 is formed so as to have a form and area substantially the same as those of the scintillator panel 40 having a rectangular planar region formed inside its rectangular ring, such that the gap between the inner face of the rectangular ring of the frame 28 and the scintillator panel 40 fitted therein is set to 500 $\mu$m or less. The frame 28 is formed with a step on the X-ray incident, extending along the inner side of the rectangular ring of the frame 28, for fitting the sheilding ring 70 therein.

The sheilding ring 70 is a rectangular ring formed from a Pb plate, and is bonded with a resin adhesive to the step formed in the surface of the frame 28 on the X-ray incident side. Here, as shown in FIG. 1, the sheilding ring 70 is formed so as to have a form and area identical to those of the frame 28 using the rectangular planar region formed inside its rectangular ring. Therefore, when the sheilding ring 70 is bonded to the step formed in the frame 28 on the upper X-ray incident side thereof, the inner peripheral face of the rectangular ring of the sheilding ring 70 and the inner side of the frame 28 coincide with each other, whereby the X-rays entering the X-ray image pickup apparatus 100 irradiate only the region where the surface of the X-ray fluorescent substance layer 44 of the scintillator panel 40 and the photosensitive region of the imaging unit 10 are in close contact with each other as shown in FIG. 1.

The lid 80 is a rectangular plate constituted by an X-ray-transparent constituent material, and is bonded to the frame 28, shield member 70, and cushion rubber 50 on the upper X-ray incident side thereof. When the lid 80 is attached, the cushion rubber 50 is pressed thereby, which further presses the scintillator panel 40 thereunder due to the elasticity of the cushion rubber 50, so that the respective gaps between the surface of the X-ray fluorescent substance layer 44 of the scintillator panel 40 and the individual photosensitive regions of the panel-like semiconductor image sensors 12A to 12D in the imaging unit 10 are reduced sufficiently, whereby they sufficiently come into close contact with each other.

An example of procedures for preparing the X-ray image pickup apparatus 100 shown in FIG. 1 will now be explained.

First, a scintillator panel 40 having a size which is four times that of each of the respective photosensitive regions of panel-like semiconductor image sensors 12A to 12D is prepared by vacuum evaporation. At this time, the warpage of the scintillator panel 40 is measured. Subsequently, a base plate 20, in which the gradient D20 of the inclined faces F20a and F20b in the upper part are adjusted according to the extent of warpage of the scintillator panel 40, is prepared. Then, four panel-like semiconductor image sensors 12A to 12D are secured onto the base plate 20 while arranging them like tiles with no gaps.

At this time, the individual panel-like semiconductor image sensors 12A to 12D and their corresponding inclined faces F20a and F20b in the base plate 20 are bonded to each other with an elastic adhesive 30. Subsequently, an outer frame member 28 with a shield member 70 fitted therein is secured onto the base plate 20. The position at which the frame 28 is secured on the base plate 20 at this time is set beforehand such that the gaps between the surface of the X-ray fluorescent substance layer 44 of the scintillator panel 40 set inside the rectangular ring of the frame 28 and the respective photosensitive regions of the four panel-like semiconductor image sensors 12A to 12D are sufficiently reduced, so that they can effectively come into close contact with each other.

Next, the scintillator panel 40 is mounted such that it is fitted inside the rectangular ring of the frame 28 while abutting onto the respective photosensitive regions of the four panel-like semiconductor image sensors 12A to 12D. At this time, the surface of the X-ray fluorescent substance layer 44 of the scintillator panel 40 is caused to face the light-receiving surface of the four panel-like semiconductor image sensors 12A to 12D disposed on the base plate 20. Subsequently, the cushion rubber 50 is fitted inside the rectangular ring of the frame 28. Finally, while the lid 80 is being mounted on the upper side of the cushion rubber 50, the periphery of the lid 80 is secured to the frame 28, and the scintillator panel 40 and the respective photosensitive regions of the panel-like semiconductor image sensors 12A to 12D are pressed by the elasticity of the cushion rubber 50 so as to come into close contact with each other.

Thus, since the X-ray image pickup apparatus 100 of this embodiment uses the scintillator panel 40, the scintillator 40 is not directly deposited on photosensitive surfaces of panel-like semiconductor image sensors, whereby the panel-like semiconductor image sensors do not lower their performances. Also, the adjusting means, i.e., the inclined faces F20a and F20b provided on the surface for mounting the base plate 20, can adjust the arrangement positions of four panel-like semiconductor image sensors 12A to 12D according to the warpage of the scintillator panel 40. Since the scintillator panel 40 is appropriately pressed by the lid 80 by way of the cushion rubber 50 made of an elastic body, a plurality of partial areas of the X-ray fluorescent substance layer 44 of the scintillator panel 40 and the photosensitive regions of the panel-like semiconductor image sensors 12A to 12D can sufficiently come into contact with each other without being damaged.

Namely, the X-ray image pickup apparatus 100 of this embodiment can attain a better resolution and improve its yield as compared with the conventional large-size X-ray image pickup apparatus. Further, the X-ray image pickup apparatus 100 of this embodiment can easily be made by simply preparing a substrate 20 having inclined faces F20a and F20b corresponding to the warpage of the scintillator panel 40 beforehand, whereby it can achieve a lower cost and improve its productivity as compared with the conventional large-size X-ray image pickup apparatus.

Though a preferred embodiment of the present invention is explained in detail in the foregoing, the present invention is not restricted to the above-mentioned embodiment.

For example, the number of panel-like semiconductor image sensors used in the X-ray image pickup apparatus of the present invention is not restricted to that of the above-mentioned embodiment in particular.

Though the above-mentioned embodiment relates to an example of X-ray image pickup apparatus using a buffer member formed from an elastic body, the constituent material for the buffer member of the X-ray image pickup apparatus of the present invention is not restricted to that of the above-mentioned embodiment as long as it can sufficiently reduce the gaps between the curved surface of the scintillator panel and the respective photosensitive regions of a plurality of panel-like semiconductor image sensors, so as to bring them into close contact with each other, and can maintain this state.

Though the above-mentioned embodiment describes a base plate as adjusting means having inclined faces in the upper part thereof according to the warpage of the scintillator panel, the adjusting means for the X-ray image pickup apparatus of the present invention is not limited to the above-mentioned embodiment and may use the adjusting means shown in FIGS. 4 to 6 as follows, for example.

Figure 4:
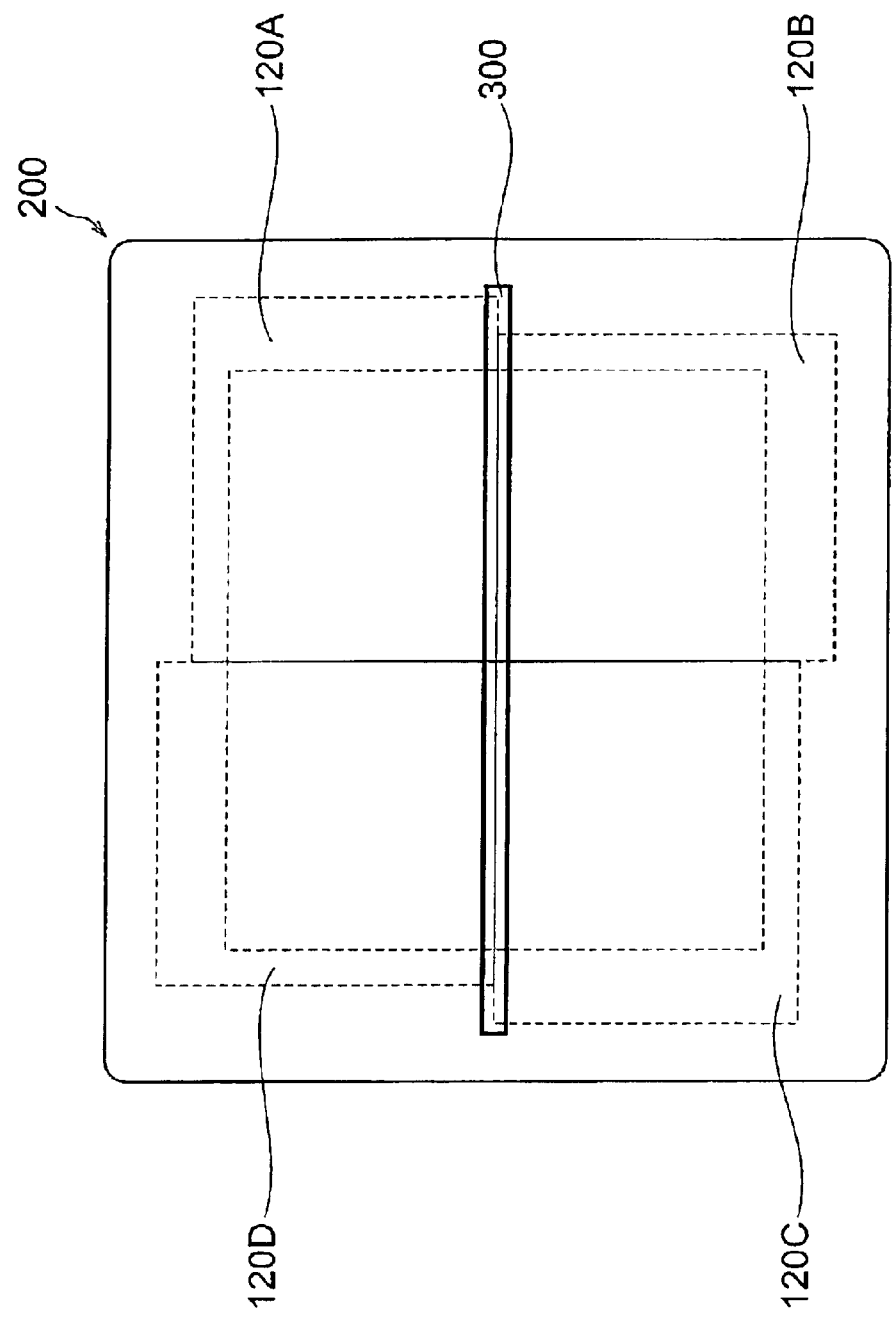
FIG. 4 is a schematic view showing another mode of adjusting means provided in an X-ray image pickup apparatus.

FIG. 4 shows one using a rectangular plate as a base plate 200, and a columnar member 300 as adjusting means which is toppled over sideways and secured to the smooth upper face of the base plate 200 with an adhesive or the like while in this state. In this case, the columnar member 300 functions like a sleeper, thus imparting an inclination to the photosensitive regions of a plurality of panel-like semiconductor image sensors 120A to 120D mounted on the base plate, whereby operations and effects similar to those of the inclined faces of the base plate 20 shown in FIGS. 1 and 2 can be obtained. In this case, the gradient of the photosensitive region of each panel-like semiconductor image sensor is adjusted by the form of the columnar member 300, the size of its bottom face, and its arrangement position on the base plate.

Figure 5:
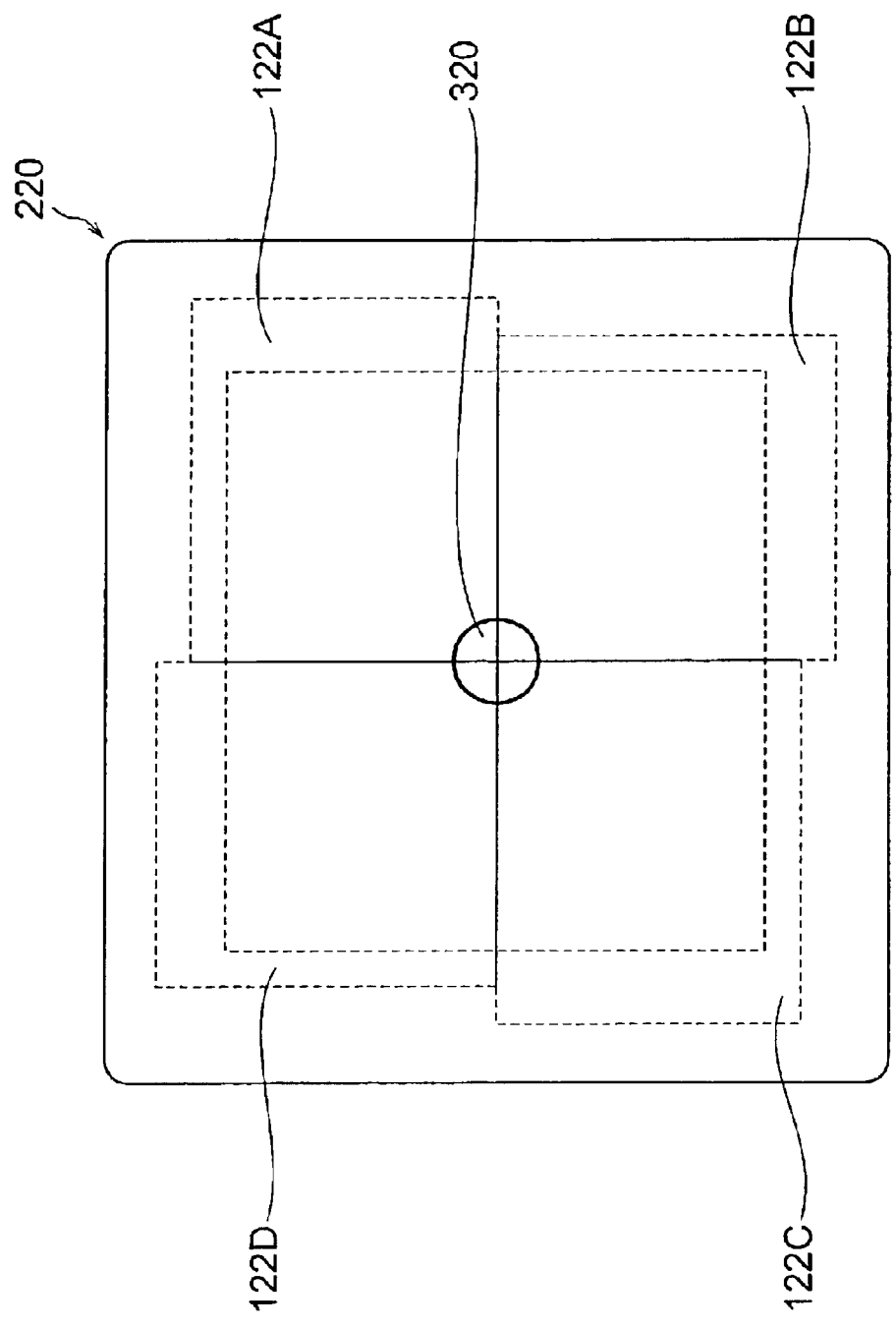
FIG. 5 is a schematic view showing another mode of adjusting means provided in an X-ray image pickup apparatus.

FIG. 5 shows one using a rectangular plate as a base plate 220, a columnar member 320 as adjusting means which is erected on the smooth upper face of the base plate 220 and secured with an adhesive or the like. Since the columnar member 320 imparts an inclination to the photosensitive regions of a plurality of panel-like semiconductor image sensors 122A to 122D on which it is mounted, operations and effects similar to those of the inclined faces of the base plate 20 shown in FIGS. 1 and 2 can be obtained in this case as well. Since the inclination of the upper face of the columnar member 320 can be regulated minutely, the inclination of the photosensitive region can be adjusted for each panel-like semiconductor image sensor, whereby the photosensitive regions can come into close contact with the X-ray fluorescent substance layer in the optimal state.

Figure 6:
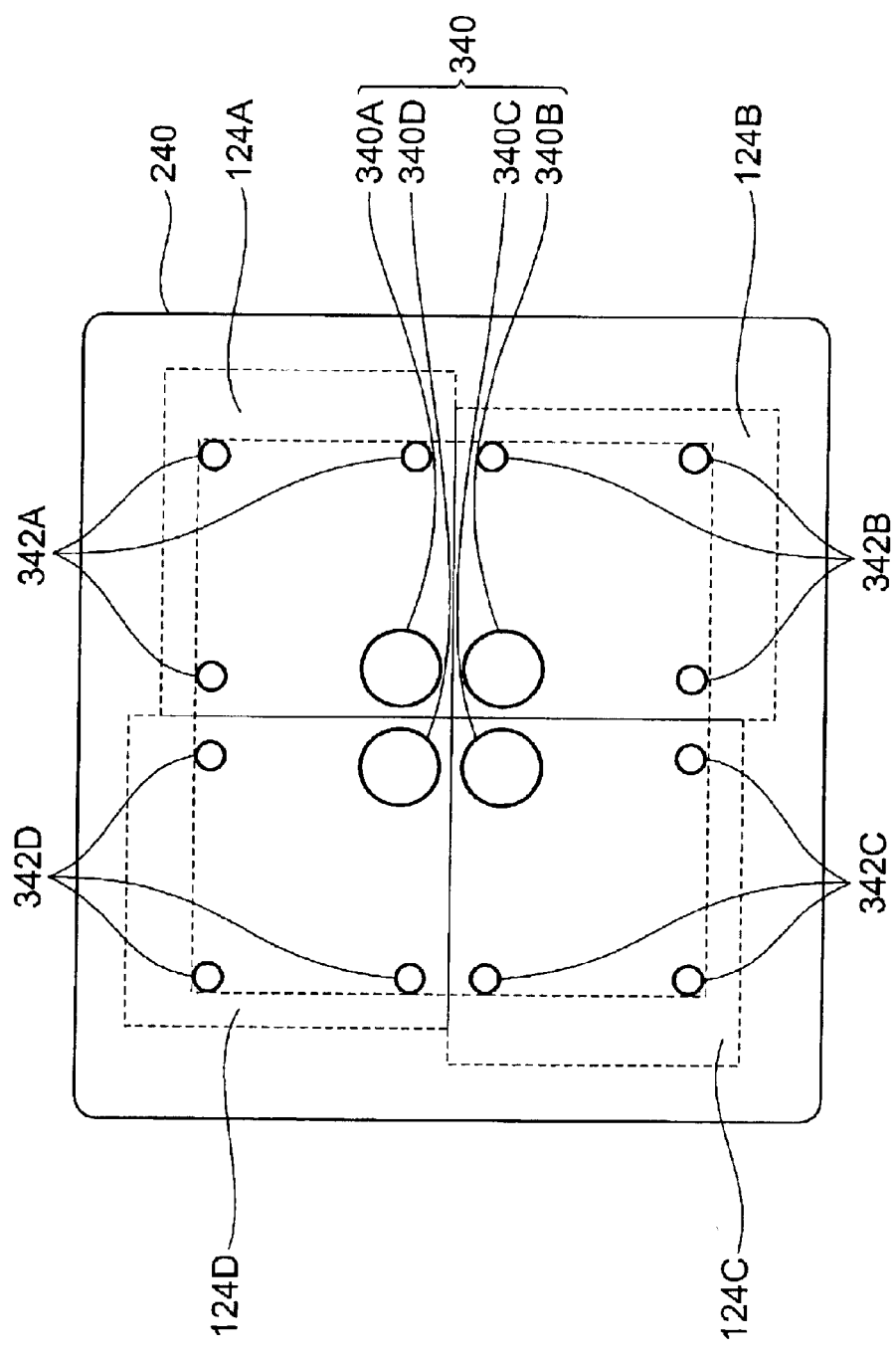
FIG. 6 is a schematic view showing another mode of adjusting means provided in an X-ray image pickup apparatus.
Figure 7A:
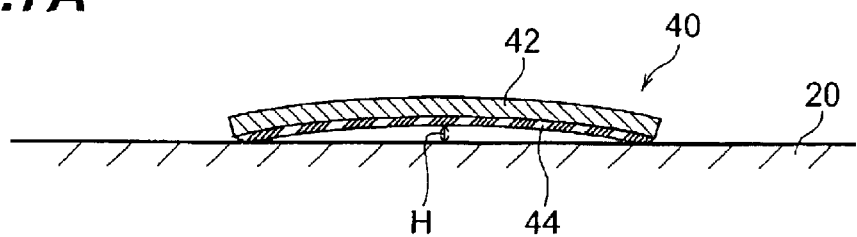
FIGS. 7A, 7B, 7C, and 7D are explanatory views for explaining a method of making an X-ray image pickup apparatus.
Figure 7B:
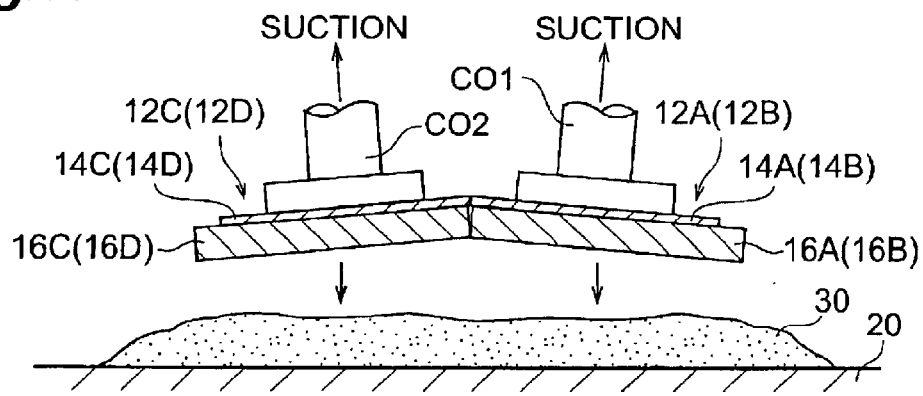
Figure 7C:
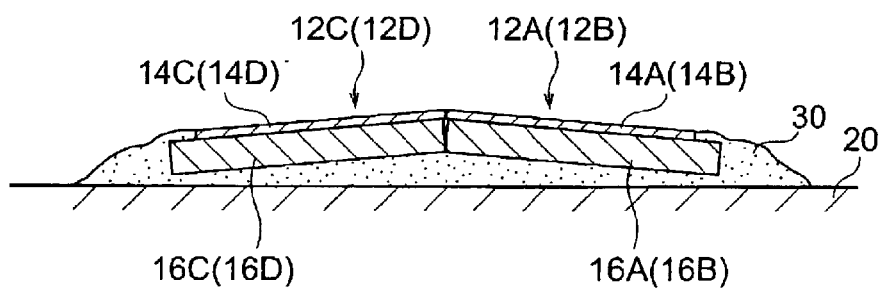
Figure 7D:
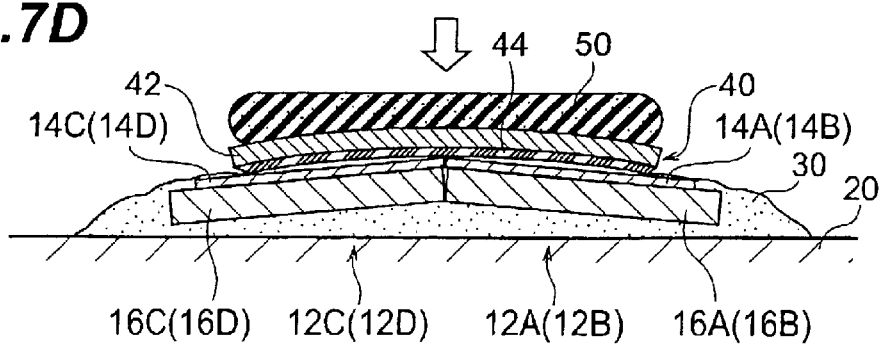

FIG. 6 is one using a rectangular plate as a base plate 240, and an adhesive 340 as adjusting means. As depicted, the adhesive 340 acting as the adjusting means can be used as being divided into adhesives 340A to 340D for respective panel-like semiconductor image sensors 124A to 124D constituting the imaging unit. The dispensing amount of adhesives 340A to 340D used in the center part of the imaging unit is made greater than that of adhesives 342A to 342D used in peripheries of the imaging unit, whereby an inclination is imparted to the photosensitive regions of panel-like semiconductor image sensors 124A to 124D mounted on the base plate 240.

Since the dispensing amount of each of the adhesives 340A to 340D can minutely be regulated, the inclination of the photosensitive region can be adjusted for each panel-like semiconductor image sensor, whereby the photosensitive regions can come into close contact with the X-ray fluorescent substance layer in the optimal state in this case as well.

Here, though the adhesive used for bonding can appropriately be selected according to the materials of the respective bonding faces of the substrate to be bonded and the base plate, it is desirable that adhesives yielding low shrinkage during cure if any be selected when the main purpose is to adjust the height of the substrate.

It is not necessary for the surface of the above-mentioned base plate 20 to be inclined. A method of making an X-ray image pickup apparatus with the surface of the base plate being made horizontal will now be explained.

FIGS. 7A, 7B, 7C, and 7D are explanatory views for explaining the method of making an X-ray image pickup apparatus.

To begin with, the warpage of a scintillator panel 40 is measured (first step). This is done by measuring the height H from a horizontal plane to the center of the scintillator panel 40 in the case where the scintillator panel is disposed on the horizontal plane. The horizontal plane is equivalent to the surface of the base plate 20. A value H' smaller than the height H is set. Image sensors 12A, 12C are attracted to collets CO1, CO2 by suction, so that the inclinations of the image sensors 12A, 12C are adjusted to such inclinations that the height of the boundary part of the image sensors 12A, 12C from the horizontal plane becomes H'. Here, semiconductor image sensor chips 14A, 14C and image sensor substrates 16A, 16C incline at the same time.

Subsequently, an adhesive 30 is applied onto the base plate 20 (second step).

Since a plurality of semiconductor image sensor chips 12 are inclined according to the extent of warpage of the scintillator panel 40, i.e., such that their boundary part attains a height of H' from the horizontal plane, the plurality of semiconductor image sensor chips 14A, 14B are disposed on the adhesive 30 while in this state (third step).

Thereafter, the scintillator panel is placed on the plurality of semiconductor image sensor chips 14A, 14C (fourth step). Then, a cushion rubber 50 made of urethane or sponge is disposed on the scintillator panel 40 and is pressed as shown in FIG. 1 (fifth step).

Though the above-mentioned second step is carried out before the adhesive 30 is solidified in the manufacturing method of this example, the thickness of the adhesive 30 may be set according to the extent of warpage, and the second step may be carried out after the adhesive is solidified.

Thus manufactured X-ray image pickup apparatus is configured such that, in an X-ray image pickup apparatus comprising the first and second semiconductor image sensor chips 14A, 14C arranged adjacent each other on the base plate 20 and the single scintillator panel 40 disposed on the first and second semiconductor image sensor chips 14A, 14C, respective planes including surfaces of the photosensitive regions of the first and second semiconductor image sensor chips 14A, 14C have normals intersecting at a predetermined angle (defined as θ).

This predetermined angle θ is greater than 0 degree but smaller than 180 degrees as seen from the scintillator panel 40 side. Also, the predetermined angle θ is set according to the warpage of the scintillator panel 40. This apparatus comprises the cushion rubber 50 for pressing the scintillator panel 40 toward the first and second image sensor chips 14A, 14C.

The scintillator panel 40 has a fluorescent substance layer 44 on the surface facing the first and second image sensor chips 14A, 14C. The angle (180+θ) obtained when 180 degrees are added to the predetermined angle θ is set smaller than the angle (defined as θ') formed between two line segments connecting respective end parts of the scintillator panel 40 extending along the arranging direction (directed from 14A to 14C) to the center of the scintillator panel 40 as seen from the scintillator panel 40 side when the scintillator panel 40 is disposed on the horizontal plane with the fluorescent substance layer 44 facing down without applying any external force onto the horizontal plane. Namely, the angle θ is set to such a value in view of the warpage caused by the above-mentioned pressure and the weight of the scintillator panel 40, whereby the imaging resolution is improved.

While this apparatus comprises first and second panel-like semiconductor image sensor substrates 16A, 16C for mounting the first and second panel-like semiconductor image sensor chips 14A, 14C, the first and second panel-like semiconductor image sensor substrates 16A, 16C are secured onto the surface of the base plate 20 by means of the adhesive 30.

Though the surface of the base plate 20 is horizontal in this example, it may be inclined according to the inclination of the first and second image sensor chips 14A, 14C as in the one shown in FIG. 1.

As explained in the foregoing, this apparatus can sufficiently reduce the gap between the curved surface of the X-ray fluorescent substance layer of the scintillator panel and the photosensitive region of each panel-like semiconductor image sensor according to the warpage of the scintillator panel, so that they can come into close contact with each other without being damaged, whereby it is possible to provide an X-ray image pickup apparatus which has a favorable image resolution and can easily be made at a low cost.

What is claimed is:

1. An X-ray image pickup apparatus comprising first and second semiconductor image sensor chips arranged adjacent each other on a base plate, and a scintillator panel disposed on said first and second semiconductor image sensor chips; wherein respective planes including surfaces of photosensitive regions of said first and second semiconductor image sensor chips have normals intersecting at a predetermined angle.

2. An X-ray image pickup apparatus according to claim 1, wherein said predetermined angle is greater than 0 degree but smaller than 180 degrees as seen from said scintillator panel side.

3. An X-ray image pickup apparatus according to claim 2, wherein said predetermined angle is set according to warpage of said scintillator panel.

4. An X-ray image pickup apparatus according to claim 3, further comprising a buffer member for pressing said scintillator toward said first and second image sensor chips.

5. An X-ray image pickup apparatus according to claim 4, wherein said scintillator panel comprises a fluorescent substance layer on a surface thereof facing said first and second image sensor chips.

6. An X-ray image pickup apparatus according to claim 5, wherein an angle obtained when 180 degrees are added to said predetermined angle is set smaller than an angle formed between two line segments connecting respective end parts of said scintillator panel extending along said arranging direction to a center of said scintillator panel as seen from said scintillator panel side when said scintillator panel is disposed on a horizontal plane with said fluorescent substance layer facing down without applying any external force onto said horizontal plane; and wherein a buffer layer for pressing said scintillator panel toward said first and second image sensor chips is provided.

7. An X-ray image pickup apparatus according to claim 5, wherein said scintillator panel comprises a hard substrate having a surface on which said fluorescent substance layer is formed, said hard substrate including at least one kind of material selected from the group consisting of Al, $SiO_2$, Be, and C.

8. An X-ray image pickup apparatus according to claim 7, wherein said fluorescent substance layer is a needle or columnar crystal growing vertically on said surface of said hard substrate.

9. An X-ray image pickup apparatus according to claim 1, wherein a surface of said support is inclined according to an inclination of said first and second image sensor chips.

10. An X-ray image pickup apparatus according to claim 1, further comprising first and second panel-like semiconductor image sensor substrates on which said first and second image sensor chips are mounted, respectively, said first and second semiconductor image sensor substrates being secured onto a surface of said support by means of an adhesive.

11. A method of making an X-ray image pickup apparatus comprising:
   a first step of measuring an extent of warpage of a scintillator panel;
   a second step of applying an adhesive onto a base plate;
   a third step of inclining a plurality of semiconductor image sensor chips according to said extent of warpage and disposing said plurality of semiconductor image sensor chips on said adhesive;
   a fourth step of disposing said scintillator panel on said plurality of semiconductor image sensor chips; and
   a fifth step of disposing and pressing a buffer member on said scintillator panel.

12. A method of making an x-ray image pickup apparatus according to claim 11, wherein said second step is carried out before said adhesive is solidified.

13. A method of making an X-ray image pickup apparatus according to claim 11, wherein a thickness of said adhesive is set according to said extent of warpage; and wherein said second step is carried out after said adhesive is solidified.

* * * * *